US009728956B2

(12) United States Patent
Chung

(10) Patent No.: US 9,728,956 B2
(45) Date of Patent: Aug. 8, 2017

(54) SURGE PROTECTION DEVICE FOR MULTI-PROTECTION MODE COMMUNICATIONS

(71) Applicant: Young-ki Chung, Seoul (KR)

(72) Inventor: Young-ki Chung, Seoul (KR)

( * ) Notice: Subject to any disclaimer, the term of this patent is extended or adjusted under 35 U.S.C. 154(b) by 243 days.

(21) Appl. No.: 14/731,182

(22) Filed: Jun. 4, 2015

(65) Prior Publication Data

US 2015/0364916 A1 Dec. 17, 2015

(30) Foreign Application Priority Data

Jun. 11, 2014 (KR) .................. 10-2014-0070976

(51) Int. Cl.
*H02H 9/04* (2006.01)
*H04L 25/00* (2006.01)
*G01R 31/28* (2006.01)

(52) U.S. Cl.
CPC .............. *H02H 9/04* (2013.01); *H02H 9/042* (2013.01); *H04L 25/00* (2013.01); *G01R 31/2827* (2013.01)

(58) Field of Classification Search
CPC .......... H02H 9/04; H02H 9/042; H04L 25/00; G01R 31/2827
See application file for complete search history.

(56) References Cited

U.S. PATENT DOCUMENTS

| | | | | |
|---|---|---|---|---|
| 7,075,767 | B2 * | 7/2006 | Gemme ................. | H01H 9/106 337/284 |
| 2011/0026179 | A1 * | 2/2011 | Kasper ................... | H02H 9/042 361/91.5 |
| 2016/0372919 | A1 * | 12/2016 | Kim ................... | G01R 31/3277 |

FOREIGN PATENT DOCUMENTS

| | | |
|---|---|---|
| JP | 2011-091915 | 5/2011 |
| KR | 101253229 | 4/2013 |

(Continued)

*Primary Examiner* — Scott Bauer
(74) *Attorney, Agent, or Firm* — Blank Rome LLP; Peter S. Weissman

(57) ABSTRACT

The present invention relates to a surge protection device for multi-protection mode communications, comprising: an input line into which a voltage is introduced; an output line connected to an external line; a surge discharge part provided with a ground terminal; a surge protection circuit part provided between the input line and the output line and having at least two or more surge protection circuits provided in parallel and discharging the introduced voltage to the ground terminal if the introduced voltage is a surge voltage; circuit conversion parts for selectively connecting the input line and the output line to any one of the surge protection circuits; a condition measuring part for measuring an input voltage introduced into an input terminal of the input line and a second discharge voltage from the surge protection circuit to the ground terminal and comparing each of the input voltage and the second discharge voltage with preset reference voltages; and a control circuit part for detecting abnormality of the connected surge protection circuit by using the comparison result of the input voltage and the comparison result of the second discharge voltage and converting the connected surge protection circuit into another one of the connected surge protection circuits through the circuit conversion parts if the abnormality of the connected surge protection circuit is detected. By the surge protection device for multi-protection mode communications, the damage to the surge protection circuits can be detected using the input surge voltage and no voltage is required to be additionally applied for detecting the damage to the surge protection circuits.

8 Claims, 5 Drawing Sheets

(56) References Cited

FOREIGN PATENT DOCUMENTS

KR  101333547  12/2013
KR  101391823  5/2014

\* cited by examiner

| First comparator | Second comparator | Determination on abnormality |
|---|---|---|
| Normal(0) | Absence(0) | Normal(1) |
| Overvoltage(1) | Absence(0) | Failure(0) |
| Normal(0) | Presence(1) | Failure(0) |
| Overvoltage(1) | Presence(1) | Normal(1) |

Fig. 6

| First comparator | Third comparator | Determination on abnormality |
|---|---|---|
| Normal(0) | Absence(0) | Normal(1) |
| Overvoltage(1) | Absence(0) | Failure(0) |
| Normal(0) | Presence(1) | Failure(0) |
| Overvoltage(1) | Presence(1) | Normal(1) |

Fig. 7

| A | B | Y |
|---|---|---|
| 0 | 0 | 1 |
| 1 | 0 | 0 |
| 0 | 1 | 0 |
| 1 | 1 | 1 |

(a)

(b)

SURGE PROTECTION DEVICE FOR MULTI-PROTECTION MODE COMMUNICATIONS

BACKGROUND OF THE INVENTION

Field of the Invention

The present invention relates to a surge protection device for multi-protection mode communications, wherein a plurality of surge protection circuits are provided such that, even though some of the circuits are stopped operating due to damage and any other reasons, the device can operate by another one of the surge protection circuits so as to prevent communications inability states in advance.

Background Art

In general, the development of communications/control systems has been increasing owing to the development of industrial automation and high-speed communications technologies. Such a communications/control system includes a very large scale integrated circuits VLSI owing to the development of semiconductor technologies and thus resistance with respect to a surge becomes weakened, increasing damage day by day. As countermeasures therefor, surge protection devices for power supply and surge protection devices for communications have been suggested to be installed. The surge protection device for power supply can be detached from a power supply system when an obstacle is generated in the power supply system due to the parallel connection of this surge protection device for power supply. However, the surge protection device for communications is connected in serial such that an obstacle very instantly and hugely influences on a communications system at the time of a communications disturbance.

Such a communications surge protection device include passive elements such as a metal oxide varistor MOV, a gas discharge tube GDT, a transient voltage suppressor TVS, a resistor and the like as main elements. The surge protection device loses natural characteristics by a surge generated inside/outside. The surge protection device is inserted in the middle of a line in serial in view of the structure of a communications system. Therefore, it is not possible to carry out normal protection for equipment to be protected when the surge protection device loses the functions thereof. Accordingly, the failure of the surge protection device due to a transient voltage/current can directly cause damage to the equipment. That is, when a surge voltage beyond the protection capacity of an overvoltage protection device is introduced into the device, elements in the overvoltage protection device are likely to be damaged and short-circuited. Particularly, the TVS or the varistor is likely to be the most damaged part and the TVS element has the highest short-circuit ratio.

However, it is not possible to check the failure of the overvoltage protection device with the naked eye. Therefore, the exchange time of the overvoltage protection device is likely to be missed even though the lifespan of the overvoltage protecting device is ended, thereby resulting in the damage to the equipment.

To this end, there has been suggested a technology for detecting a short-circuit of any one or more of the varistors and the TVSs and displaying the detection result by LEDs, thereby enabling immediate countermeasures to be carried out [Patent Document 1]. Further, there has been suggested a technology for operating the life of a varistor and carrying out connection conversion when the life reaches a predetermined critical value [Patent Document 2]. However, the prior art technologies still have a problem that no partial damage instead of such a short-circuit can be recognized, generating damage to equipment when a surge is introduced.

In order to solve the above mentioned problems, there have been suggested technologies for providing a plurality of surge protection circuits and automatically converting one surge protection circuit into any other one if the one surge protection circuit becomes impossible to carry out the surge protection operation [Patent Documents 3 and 4].

As shown in FIG. 1, the prior art surge (overvoltage) protection device includes a plurality of surge discharge parts 300. That is, the plurality of surge discharge parts 300 are provided between an input line discharge part 100 and an output line discharge part 200 so as to be spaced from each other at a predetermined distance, and are selectively connected to the input line discharge part 100 and the output line discharge part 200 so as to prevent a surge or overcurrent, which is introduced from the input line discharge part 100, from being discharged to the output line discharge part 200.

Specifically, the surge discharge part 300 includes a first surge discharge circuit 310 having a first linear resistor 311 and a first TVS 312, which are connected to the input line in serial, and a second surge discharge circuit 320 having a second linear resistor 321 and a second TVS 322, wherein the first surge discharge circuit 310 and the second surge discharge circuit 320 are positioned in parallel. At this time, the first surge discharge circuit 310 and the first surge discharge circuit 320 of the surge discharge part 300 are selectively connected to the input line discharge part 100 by a first connection part 400 and selectively connected to the output line discharge part 200 by a second connection part 500.

At this time, a voltage is applied between the input line discharge part 100 and the output line discharge part 200 so as to check damage to the surge discharge circuit. A checking voltage is applied to an input line 110 through the connection to the input line discharge part 100. Particularly, the checking voltage is applied to the both ends of the input line 110 through the connection to the both ends of the first GDT 120 of the input line discharge part 100.

Further, the voltage between the surge discharge circuits of the surge discharge part 300 connected to the input line discharge part 100 and the output line discharge part 200 is detected to be recognized. That is, if the first surge discharge circuit 310 is connected, the voltage between the first surge discharge circuit 310 and the input and output line discharge parts 100 and 200 can be recognized and, if the second surge discharge circuit 320 is connected, the voltage between the second surge discharge circuit 320 and the input and output line discharge parts 100 and 200 can be recognized. The detected voltage is compared with a reference voltage so as to determine the abnormality of the connected surge discharge circuit. If the abnormality of the connected surge discharge circuit 310 or 320 is determined, the connection is converted from the connected surge discharge circuit 310 or 320 to another surge discharge circuit 310 or 320, which is not damaged.

However, the prior art [Patent Document 3] still has a problem that additional voltages have to be applied in order to determine the damage to the surge discharge circuit.

PRIOR ART DOCUMENTS

Patent Documents

[Patent Document 1] Korean Patent No. 10-1253229 (Published on 4 Apr. 2013)
[Patent Document 2] Japanese Patent Publication No. 5399856 (Published on 29 Jan. 2014)

[Patent Document 3] Korean Patent No. 10-1333547 (Published on 2 Dec. 2013)

[Patent Document 4] Korean Patent No. 10-1391823 (Published on 7 May 2014)

SUMMARY OF THE INVENTION

Accordingly, the present invention has been made to solve the above-mentioned problems occurring in the prior arts, and it is an objective of the present invention to provide a surge protection device for multi-protection mode communications, wherein a plurality of surge protection circuits are provided such that, even though some of the surge protection circuits are stopped operating due to damage and any other reasons, the device can operate by another one of the surge protection circuits so as to prevent communications inability states in advance.

Particularly, it is an objective of the present invention to provide a surge protection device for multi-protection mode communications, wherein damage to surge protection circuits is detected simultaneously with the applying of a surge voltage so as to convert connection to one of the surge protection circuits to another one of the surge protection circuits.

In order to achieve the above objectives, the present invention provides a surge protection device for multi-protection mode communications, comprising: an input line into which a voltage is introduced; an output line connected to an external line; a surge discharge part provided with a ground terminal; a surge protection circuit part provided between the input line and the output line and having at least two or more surge protection circuits which are provided in parallel and discharge the introduced voltage to the ground terminal if the introduced voltage is a surge voltage; circuit conversion parts for selectively connecting the input line and the output line to any one of the surge protection circuits; a condition measuring part for measuring an input voltage introduced into an input terminal of the input line and a second discharge voltage (the second discharge voltage in the present invention refers to a voltage which is converted from the current flowing from the surge protection circuit part to the ground terminal) from the surge protection circuit to the ground terminal and comparing each of the input voltage and the second discharge voltage with preset reference voltages; and a control circuit part for detecting abnormality of the connected surge protection circuit by using the comparison result of the input voltage and the comparison result of the second discharge voltage and converting the connection of the connected one of the surge protection circuits into another one of the surge protection circuits through the circuit conversion parts if the abnormality of the connected surge protection circuit is detected.

Further, in the surge protection device for multi-protection mode communications according to the present invention, the control circuit part detects the abnormality of the surge protection circuit if the comparison result of the input voltage and the comparison result of the second discharge voltage are the same as each other while the control circuit part detects the normality of the surge protection circuit if the comparison result of the input voltage and the comparison result of the second discharge voltage are different from each other.

Further, in the surge protection device for multi-protection mode communications according to the present invention, the condition measuring part includes: a first comparator for outputting 1 as a comparison result if the input voltage is larger than the reference voltage while outputting 0 as a comparison result if the input voltage is smaller than the reference voltage; and a third comparator for outputting 1 as a comparison result if the second discharge voltage is larger than the reference voltage while outputting 0 as a comparison result if the second discharge voltage is smaller than the reference voltage, and the control circuit part includes an XNOR gate for receiving outputs from the first comparator and the third comparator as inputs and converting the surge protection circuit if the output from the XNOR gate is 0.

Further, in the surge protection device for multi-protection mode communications according to the present invention, the surge protection circuit includes: a linear resistor positioned in serial with respect to the input line; and a transient voltage suppressor TVS connected between the input line and the output line in parallel.

Further, in the surge protection device for multi-protection mode communications according to the present invention, the device includes: an input discharge part provided on the input line and discharging the surge voltage introduced into the input line to the ground terminal; and an output discharge part provided on the output line and discharging the surge voltage inversely introduced into the output line to the ground terminal.

Further, in the surge protection device for multi-protection mode communications according to the present invention, the condition measuring part measures a first discharge voltage from the input discharge part or the output discharge part to the ground terminal and compares the first discharge voltage with the preset reference voltage, and the control circuit part detects the abnormality of the input discharge part or the output discharge part by using the comparison result of the input voltage and the comparison result of the first discharge voltage.

Further, in the surge protection device for multi-protection mode communications according to the present invention, the control circuit part detects the abnormality of the input discharge part or the output discharge part if the comparison result of the input voltage and the comparison result of the first discharge voltage are the same as each other while the control circuit part detects the normality of the input discharge part or the output discharge part if the comparison result of the input voltage and the comparison result of the first discharge voltage are different from each other.

Further, in the surge protection device for multi-protection mode communications according to the present invention, the input discharge part or the output discharge part includes a gas discharge tube GDT which is provided on the input line or the output line in parallel and connected to the ground terminal.

As described above, by the surge protection device for multi-protection mode communications according to the present invention, a plurality of the surge protection circuits are provided such that, even though some of the surge protection circuits are stopped operating due to damage and any other reasons, the device can operate by another one of the surge protection circuits so as to prevent communications inability states in advance.

Further, by the surge protection device for multi-protection mode communications according to the present invention, damage to the surge protection circuits can be detected using the input surge voltage and no voltage is required to be additionally applied for detecting the damage to the surge protection circuits.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 6 is a table showing the determination of abnormality in surge protection circuits according to the output combination of the first and third comparators according to a preferred embodiment of the present invention.

FIG. 7 is a logic truth table with respect to the determination of FIG. 5 and FIG. 6 according to a preferred embodiment of the present invention.

DETAILED DESCRIPTION OF THE PREFERRED EMBODIMENT

Figure 1:
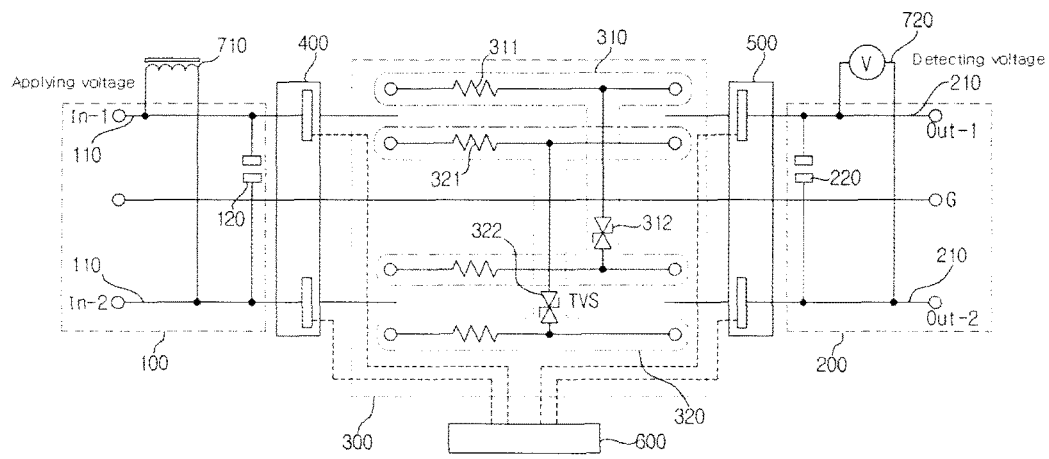
FIG. 1 is a circuit diagram showing a prior art surge protection device.

Reference will be now made in detail to the preferred embodiments of the present invention with reference to the attached drawings.

In addition, in the description of the present invention, the same components have the same reference numerals and the repetitive explanation thereof is omitted.

First, the schematic structure of a surge protection device for multi-protection mode communications according to a preferred embodiment of the present invention will be described with reference to FIG. 2.

Figure 2:
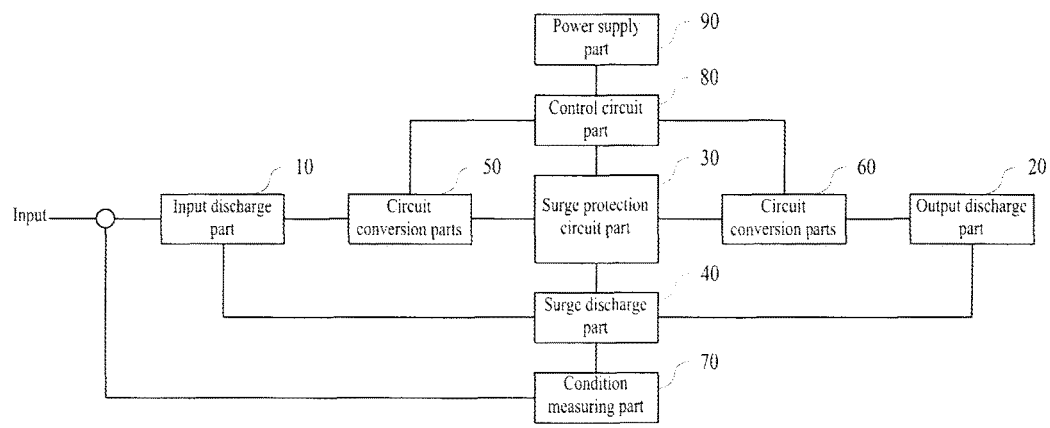
FIG. 2 is a block diagram showing the structure of a surge protection device for multi-protection mode communications according to a preferred embodiment of the present invention.

As shown in FIG. 2, a surge protection device for multi-protection mode communications includes an input discharge part 10, an output discharge part 20, a surge protection circuit part 30, a surge discharge part 40, circuit conversion parts 50 and 60, a condition measuring part 70, a control circuit part 80 and a power supply part 90.

The input discharge part 10 is positioned at an input terminal and protects a first surge. In particular, the input discharge part 10 is provided with a gas discharge tube GDT which is connected to the surge discharge part 40. As a surge voltage is introduced, the surge voltage is first discharged through the GDT to the ground terminal G of the surge discharge part 40.

Further, the output discharge part 20 is a circuit which is positioned at an output terminal and carries out protection with respect to a surge inversely introduced from the output terminal. The output discharge part 20 has the same structure as the input discharge part 10 such that the output discharge part 20 discharges the inversely introduced surge voltage through the ground terminal G (or the surge discharge part).

The surge protection circuit part 30 includes a plurality of surge protection circuits to be converted by the circuit conversion parts 50, 60. That is, the surge protection circuit part 30 includes a plurality of surge protection circuits, which are spaced from each other at a predetermined distance between the input discharge part 10 and the output discharge part 20 and are selectively connected to the input discharge part 10 and the output discharge part 20. Therefore, the surge protection circuit part 30 prevents an overvoltage, which is introduced from the input discharge part 10, from being applied to the output discharge part 20, or discharges an overcurrent, which is inversely introduced from the output discharge part 20, through the surge discharge part 40.

The surge discharge part 40 is a circuit for discharging the surge current, which is bypassed from the input discharge part 10, the output discharge part 20 and the surge protection circuit part 30, to the ground terminal G.

The circuit conversion parts 50, 60 substitute and change the protection circuits of the surge protection circuit part 30, which includes the plurality of surge protection circuits, according to a command of the control circuit part 80.

The input circuit conversion part 50 is a connection part for connecting any one of the plurality of surge protection circuits. That is, the input circuit conversion part 50 selectively converts the connection of the input line 11 to any one of the plurality of surge protection circuits.

The output circuit conversion part 60 selects any one of the plurality of surge protection circuits and converts the connection of the output line 21 of the output terminal to the selected one.

At this time, both the input circuit conversion part 50 and the output circuit conversion part 60 select the same one of the surge protection circuits so as to be connected to each other through the selected one of the surge protection circuits.

The condition measuring part 70 is a circuit for measuring the voltage condition of the input terminal, the discharge conditions of the input and output discharge parts and the discharge conditions of the surge protection circuits. That is, the condition measuring part 70 is positioned at the front end side of the input discharge part 10 so as to detect the voltage of the input part such that the condition measuring part 70 detects a normal condition and an abnormal condition, in which a transient voltage (or a surge) is introduced, by using the detected voltage. Further, the condition measuring part 70 measures a discharge condition by the input and output discharge parts 10, 20 or the surge protection circuit part 30. The measurement of the input voltage (or the condition of the input voltage) can be carried out by the input line 11, which is positioned next to the discharge circuit of the input discharge part 10, because the surge voltage is not completely but partially discharged by the input discharge part 10 and the remaining voltage is inputted through the input line 11 to the surge protection circuit part 30.

The control circuit part 80 determines the abnormality of the surge protection circuit part 30 by comparing the values measured in the condition measuring part 70. According to the abnormality determination, the control circuit part 80 sends a conversion command to the circuit conversion parts 50, 60, thereby converting the connection to another normal surge protection circuit.

The power supply part 90 is a circuit for supplying power to the control circuit part 80 and the circuit conversion parts 50, 60. Differently from a power supply surge protection device, a communications surge protection device is likely generate communications errors if the communications surge protection device uses the voltage of a communications line as power. Therefore, the communications surge protection device has to be stably supplied with power in addition to the voltage of the communications line. To this end, an additional power supply part 90 is provided so as to supply operation power to the control circuit part 80 and the circuit conversion parts 50, 60.

Next, the surge protection device for multi-protection mode communications according to a preferred embodiment of the present invention will be described in more detail with respect to the structure and operations with reference to FIG. 3.

Figure 3:
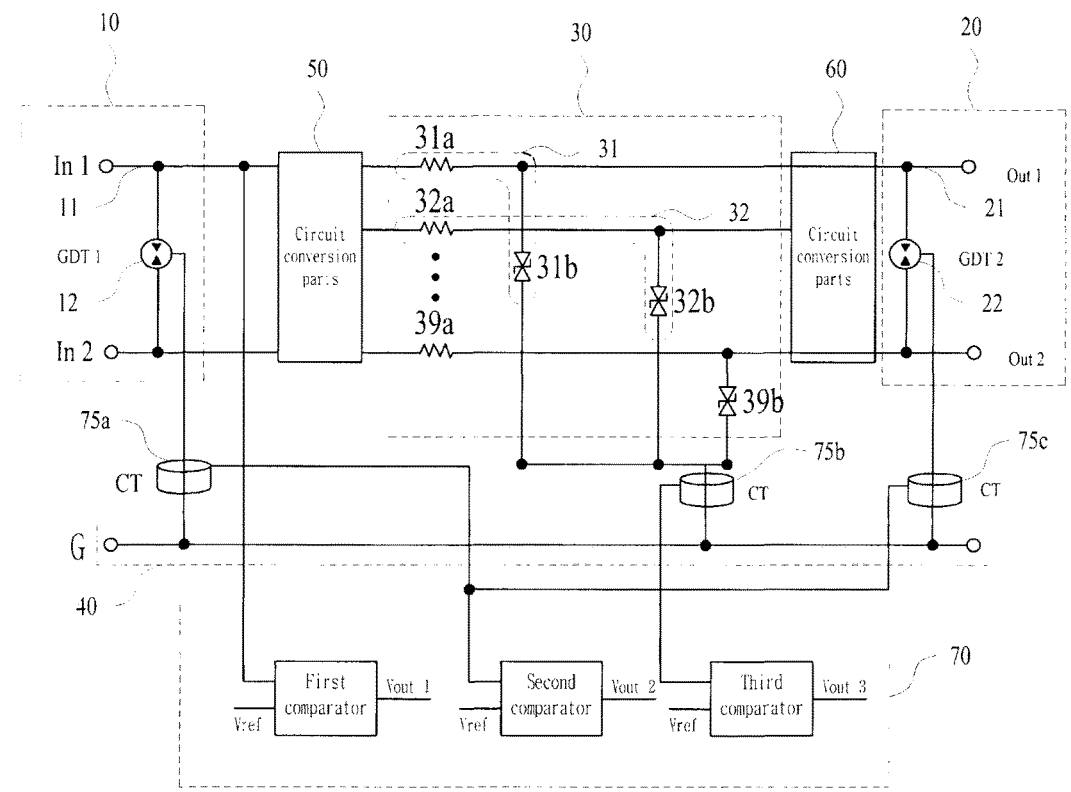
FIG. 3 is a circuit diagram showing a surge protection device for multi-protection mode communications according to a preferred embodiment of the present invention.

As shown in FIG. 3, the input terminals and the output terminals are respectively provided to the input discharge part 10 and the output discharge part 20.

The input discharge part 10 includes input terminals In1, In2 of the input line 11 so as to introduce a surge, and a first GDT 12 which is provided on the input line 11 in parallel. The first GDT 12 is connected to the ground terminal G of the surge discharge part 40 so as to first discharge the surge voltage which is introduced to the input line 11. That is, the first GDT 12 becomes open at a discharge starting voltage or less. In addition, if a surge exceeding the discharge starting voltage is introduced, the first GDT 12 is instantly conducted to remove the surge and then carries out the operation in the open state again.

The output discharge part 20 includes output terminals Out1, Out2 of the output line 21, which is connected to an external communications/signal line, and a second GDT 22 which is provided on the output line 21 in parallel. The second GDT 22 is connected to the ground terminal G of the surge discharge part 40 so as to discharge a voltage, which is inversely introduced from the output line 21, through the ground terminal G.

Further, as shown in FIG. 3, the surge protection circuit part 30 includes a first surge protection circuit 31 which is directly connected to the input line and has a first linear resistor 31a and a first TVS 31b, and a second surge protection circuit 32 which has a second linear resistor 32a and a second TVS 32b, wherein the first surge protection circuit 31 and the second surge protection circuit 32 are positioned in parallel. It is possible to further connect a plurality of surge protection circuits in parallel in addition to the first surge protection circuit 31 and the second surge protection circuit 32.

At this time, the first surge protection circuit 31, the second surge protection circuit 32, and the additional plurality of surge protection circuits of the surge protection circuit part 30 are selectively connected to the input discharge part 10 by the input circuit conversion part 50, which is described hereinafter, and to the output discharge part 20 by the output circuit conversion part 60.

The first and second linear resistors 31a, 32a are positioned on the input line 11 (In1, In2) of the input discharge part 10 in serial and limit an overcurrent which is introduced so as to prevent short-circuit as the first and second linear resistors 31a, 32a are selectively connected to the input line 11 by the input circuit conversion part 50. The first and second linear resistors 31a, 32a are commercialized elements used in a surge protection device and thus are not intended to limit the capacity, kind and shape of the resistors.

The first and second TVSs 31b, 32b are connected between the input line 11 (In1, In2) of the input discharge part 10 and the output line 21 (Out1, Out2) of the output discharge part 20 in parallel and discharge a surge voltage, which is inversely introduced from the input line 11 or the output line 21, through the ground terminal GND as the first and second TVSs 31b, 32b are selectively connected to the input line 11 and the output line 21 by the circuit conversion parts 50, 60. That is, the first and second TVSs 31b, 32b limit a remaining transient voltage between lines so as to prevent the introduction of a voltage equal to or higher than a dielectric breakdown voltage into a sensor or a measuring instrument.

Further, the first and second TVSs 31b, 32b are connected to the ground terminal G of the surge discharge part 40 such that an input surge voltage is discharged through the ground terminal G.

The structures of the surge protection circuits 31, 32 as shown in FIG. 3 are simple examples of such circuits. Therefore, the resistors and the TVSs are not limited to the linear resistors and the transient voltage suppressors TVSs as shown in FIG. 3. For example, varistors serving as overvoltage protection elements can be provided or protection circuits for providing the TVSs and the varistors in parallel and the like can be also applied in the present invention.

Further, it is not possible to shut off a surge 100% by just the first and second GDTs 12, 22. The main function of the GDT and the MOV is to limit a surge voltage. If a surge voltage of, for example, 10 Kv is applied, the surge voltage is lowered to, for example, 2.5 Kv. The voltage thus lowered by the operations of the first and second GDTs 12, 22 is further lowered by the TVS diode. Therefore, the overvoltage on a line becomes minimized. For the same reason, it is preferable to use the GDT and the TVS in parallel.

All the GDT, the TVS and the MOV have the function of limiting an overvoltage. However, each of the elements has different components. The GDT is formed of gas, the TVS is a semiconductor element, and the MOV is a varistor. As the components of each of the elements are different, the elements have different response characteristics with respect to a surge. The GDT has a problem of follow current while carrying out discharge when a surge is introduced. Therefore, the GDT is not used for a line and N-phase but mostly used for N-phase and the ground. As for communications, the TVS element is used instead of the MOV so as to prevent signal errors possibly generated in communications.

The GDT has a larger current discharge capacity rather than the TVS element. In general, the GDT has a surge discharge capacity of 10KA~20KA or higher. The TVS element has a small surge capacity and thus has a high damage possibility. Therefore, for protection, a GDT having a high surge capacity is used.

As described hereinafter, the failure of the GDT can be recognized by providing a CT to each of the CDT lines.

Meanwhile, the input circuit conversion part 50 is positioned between the input discharge part 10 and the surge protection circuit part 30 and selectively connects the input line 11 to any one of the first and second surge protection circuits 31, 32 and the plurality of surge protection circuits of the surge protection circuit part 30.

The output circuit conversion part 60 is positioned between the surge protection circuit part 30 and the output discharge part 20 and selectively connects the output line 21 to any one of the first and second surge protection circuits 31, 32 and the plurality of surge protection circuits of the surge protection circuit part 30.

At this time, both the input circuit conversion part 50 and the output circuit conversion part 60 select the same one of the surge protection circuits and are thus connected to each other through the selected one of the surge protection circuits. For example, if the input circuit conversion part 50 is connected to the first surge protection circuit 31, the output circuit conversion part 60 also has to be connected to the first surge protection circuit 31. In the same manner, if the input circuit conversion part 50 is connected to the second surge protection circuit 32, the output circuit conversion part 60 also has to be connected to the second surge protection circuit 32.

Further, if the input circuit conversion part 50 and the output circuit conversion part 60 are connected to the first surge protection circuit 31, the first surge discharge circuit 31 is driven so as to remove an introduced surge and, if the input circuit conversion part 50 and the output circuit conversion part 60 are connected to the second surge protection circuit 32, the second surge protection circuit 32 is driven to remove an introduced surge.

Next, the condition measuring part 70 includes a first comparator 71, a second comparator 72 and a third comparator 73.

The condition measuring part 70 is a comparison circuit for measuring a surge voltage by using an operational amplifier OPAMP. That is, each of the comparators 71, 72, 73 is a comparison circuit using an operational amplifier OPAMP so as to compare a normal condition voltage with a transient voltage by a surge.

Figures 4, 5:
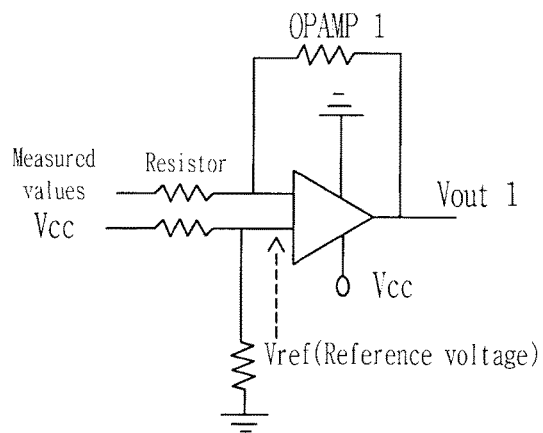
FIG. 4 is a circuit diagram showing a comparator according to a preferred embodiment of the present invention.
FIG. 5 is a table for explaining the determination of abnormality in the discharge circuits of input and output discharge parts according to output combination of first and second comparators according to a preferred embodiment of the present invention.

As shown in FIG. 4, the OPAMP is provided with two inputs, wherein the OPAMP outputs a signal High if a measurement value compared with a reference value (for example, if the voltage of a line is 24V, 24V is applied as the reference voltage value) is higher than the reference value and the OPAMP outputs a signal Low if the measurement value is the same as the reference value.

The comparison circuit using such an OPAMP includes three circuits such as the first comparator 71 for measuring a voltage, the second comparator 72 for measuring the discharge current of an input and an output, and the third comparator 73 for measuring the current discharged from the TVS diode of the surge protection circuit.

The first comparator 71 compares the input voltage of the input terminals as a measurement value with a reference voltage Vref. That is, the first comparator 71 is a circuit for receiving the reference voltage Vref and the input voltage and comparing the both voltages so as to output a comparison result. That is, the first comparator 71 outputs a signal High (or 1) if the input voltage is higher than the reference voltage, and the first comparator 71 outputs a signal Low (or 0) if the input voltage is the same as the reference voltage.

Further, the second comparator 72 is applied to current transformer CT sensors 75a, 75b, which are the surge measuring circuits, and outputs a signal High (or 1) if there is an output higher than normal conditions. The CT sensors 75a, 75b of the second comparator 72 are the circuits which measure the GDT current of the input terminals and the output terminals and are connected in parallel.

The CT sensors 75a, 75b are provided between the input discharge part 10 or the output discharge part 20 and the surge discharge part 40 (or the ground terminal).

In general, the surge introduced into the input terminal is mostly discharged at the first GDT 12 of the input terminal, while almost no discharge is carried out at the second GDT 22 of the output terminal. Therefore, even though the outputs of the CT sensors 75a, 75b of the input and output terminals are connected in parallel, the current measurement values at the time of surge introduction are not overlapped.

Further, the third comparator 73 compares the measurement value of the CT sensor 75c, which measures the discharge of the surge protection circuit part 30, with a reference voltage. The feature of comparing the output of the CT sensor 75c of the third comparator 73 as a measurement value is the same as that of the second comparator 72. The CT sensor 75c is provided between the surge protection circuit part 30 or TVSs 32a, 32b and the surge discharge part 40 or the ground terminal G.

In conclusion, the first comparator 71 detects whether an input voltage is a transient voltage or a surge, and outputs a signal High or 1 if the input voltage is a surge voltage. To the contrary, the first comparator 72 outputs a signal Low or 0 if the input voltage is not a surge.

Further, the second comparator 72 detects whether a surge is discharged in the input discharge part 10 or the output discharge part 20 and outputs a signal High or 1 if a surge is discharged. Further, the second comparator 72 outputs a signal Low or 0 if the input and output discharge parts 10, 20 do not discharge a surge.

Further, the third comparator 73 detects whether a surge is discharged in the surge protection circuit part 30 and outputs a signal High or 1 if a surge is discharged. Further, the third comparator 73 outputs a signal Low or 0 if the surge protection circuit part 30 does not discharge a surge.

Next, the control circuit part 80 determines the abnormality of the currently connected surge protection circuit by using the input voltage state by the measurement of condition measuring part 70 and the discharge states detected by the measurement of the input and output discharge parts 10, 20 and the surge protection circuit part 30. Further, if the currently connected surge protection circuit is determined to be abnormal, the control circuit part 80 converts the connection to another normal one of the surge protection circuits.

The determination of the damage due to a surge is very important. In order to prevent wrongful recognition of a normally operating circuit as an abnormal circuit, accurate references are provided, which are specifically described hereinafter.

As shown in FIG. 5, it is possible to determine the abnormality of the discharge circuits or the GDTs of the input and output discharge parts 10, 20 by combining the input voltage state detected by the first comparator 71 and the discharge states of the input and output discharge parts 10,20 detected by the second comparator 72.

That is, if an input voltage is a normal voltage (the output of the first comparator is 0) and no surge is detected at the first and second GDTs 12, 22 of the input and output discharge parts 10, 20 (the output of the second comparator is 0), it can be recognized that the first and second GDTs 12, 22 are normal. To the contrary, if a surge is detected in the first and second GDTs 12, 22 (the output of the second comparator is 1) at a normal voltage (the output of the first comparator is 0), it can be recognized that the first and second GDTs 12, 22 are abnormal.

Further, if a surge is detected in the first and second GDTs 12, 22 of the input and output discharge parts 10, 20 (the output of the second comparator is 1) in a state where an input voltage is abnormal, that is, a surge is inputted (the output of the first comparator is 1), it can be recognized that the first and second GDTs 12, 22 are normal. To the contrary, if a surge is detected in the first and second GDTs 12, 22 in a surge state (the output of the first comparator is 1), it can be recognized that the first and second GDTs 12, 22 are normal.

Further, as shown in FIG. 6, the abnormality of the surge protection circuits of the surge protection circuit part 30 or the GDTs can be determined by combining the input voltage state detected by the first comparator 71 and the discharge state of the surge protection circuit part 30 detected by the third comparator 73. The method of determining the abnormality of FIG. 6 is the same as that of FIG. 5.

FIG. 7 shows a logic truth table of the abnormality determination with respect to the inputs of the comparators shown in FIG. 5 and FIG. 6. Referring to FIG. 7, 0 represents that two input values are different from each other and 1 represents that two input values are the same. It can also be represented by the formula below.

$$Y=!((!A)B)+(A(!B)))$$ [Equation 1]

Wherein, A and B represent the outputs of the comparators, and Y represents abnormality determination results.

That is, as for the outputs of the respective comparators, the surge voltage and the CT output (or the GDT output), and the surge voltage and the TVS output are applied as the XNOR gate inputs with reference to the output of the first comparator 71, which detects the introduction of a surge, thereby obtaining two results.

The abnormality of a circuit is determined by setting a determination reference through the application of the XNOR gate circuit in flip-flop circuits. The determination references for the control circuit part 80 to assign conversion commands to the circuit conversion parts 50, 60 are set by formula 1 or as shown in FIG. 7.

Figure 8:
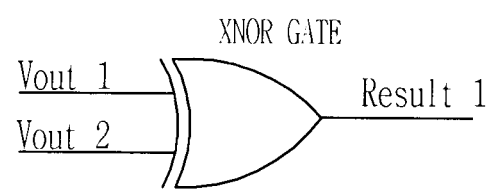
FIG. 8 is a circuit diagram showing a control circuit part according to a preferred embodiment of the present invention.
Figure 8:
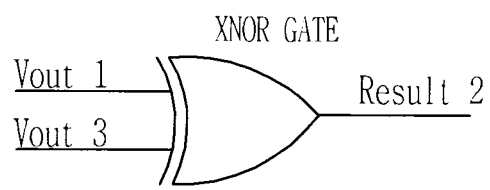

This can be implemented as a circuit, as shown in FIG. 8.

The output Vout1 of the first comparator 71 and the output Vout2 of the second comparator 72 are provided as the inputs of the XNOR gate such that, according to the output of the XNOR gate, the abnormality of the first or second GDT 12, 22 of the input and output discharge parts 10, 20 is detected.

Further, the output Vout1 of the first comparator 71 and the output Vout3 of the third comparator 73 are provided as the inputs of the XNOR gate such that, according to the output of the XNOR gate, the abnormality of the first or second TVS 31b, 32b of the surge protection circuit part 30 is detected.

As described hereinabove, the normal state of an input voltage and the introduction state of a transient voltage due to lightning are considered as a single condition, another condition is provided as an input from the CT sensor current transformer connected between the GDTs and the ground, and the current flowing from the TVS is measured as the other condition, such that the normality/abnormality is accurately determined by the control circuit part 80 on the basis of these three conditions so as to accurately provide a conversion command.

As described above, while the present invention derived by the prevent inventor has been particularly shown and described with reference to the example embodiments thereof, it will be understood by those of ordinary skill in the art that the above embodiments of the present invention are all exemplified and various changes, modifications and equivalents may be made therein without changing the essential characteristics and scope of the present invention. Therefore, it would be understood that the present invention is not limited to the forms described in the example embodiments.

BRIEF EXPLANATION OF REFERENCE SYMBOL

10: input discharge part
11: input line
12: first GDT
20: output discharge part
21: output line
22: second GDT
30: surge protection circuit part
31, 32: surge protection circuits
31a, 32a: first, second linear resistor
31b, 32b: first, second TVS
40: surge discharge part
50: input circuit conversion part
60: output circuit conversion part
70: condition measuring part
71, 72, 73: first, second and third comparator
75a, 75b, 75c: CT sensor
80: control circuit part
90: power supply part

What is claimed is:

1. A surge protection device for multi-protection mode communications, comprising:
    an input line into which a voltage is introduced;
    an output line connected to an external line;
    a surge discharge part provided with a ground terminal;
    a surge protection circuit part provided between the input line and the output line and having at least two or more surge protection circuits which are provided in parallel and discharge the introduced voltage to the ground terminal if the introduced voltage is a surge voltage;
    circuit conversion parts for selectively connecting the input line and the output line to any one of the surge protection circuits;
    a condition measuring part for measuring an input voltage introduced into an input terminal of the input line and a second discharge voltage from the surge protection circuit to the ground terminal and comparing each of the input voltage and the second discharge voltage with preset reference voltages; and
    a control circuit part for detecting abnormality of the connected surge protection circuit by using the comparison result of the input voltage and the comparison result of the second discharge voltage and converting the connection of the connected surge protection circuit into another one of the surge protection circuits through the circuit conversion parts if the abnormality of the connected surge protection circuit is detected.

2. The surge protection device for multi-protection mode communications according to claim 1, wherein the control circuit part detects the abnormality of the surge protection circuit if the comparison result of the input voltage and the comparison result of the second discharge voltage are the same as each other while the control circuit part detects the normality of the surge protection circuit if the comparison result of the input voltage and the comparison result of the second discharge voltage are different from each other.

3. The surge protection device for multi-protection mode communications according to claim 1, wherein the condition measuring part includes:
    a first comparator for outputting 1 as a comparison result if the input voltage is larger than the reference voltage while outputting 0 as a comparison result if the input voltage is smaller than the reference voltage; and
    a third comparator for outputting 1 as a comparison result if the second discharge voltage is larger than the reference voltage while outputting 0 as a comparison result if the second discharge voltage is smaller than the reference voltage, and
    the control circuit part includes an XNOR gate for receiving outputs from the first comparator and the third comparator as inputs and converting the surge protection circuit if the output from the XNOR gate is 0.

4. The surge protection device for multi-protection mode communications according to claim 1, wherein the surge protection circuit includes: a linear resistor positioned in serial with respect to the input line; and a transient voltage suppressor TVS connected between the input line and the output line in parallel.

5. The surge protection device for multi-protection mode communications according to claim 1, wherein the device includes:
an input discharge part provided on the input line and discharging the surge voltage introduced into the input line to the ground terminal; and
an output discharge part provided on the output line and discharging the surge voltage inversely introduced into the output line to the ground terminal.

6. The surge protection device for multi-protection mode communications according to claim 5, wherein the condition measuring part measures a first discharge voltage from the input discharge part or the output discharge part to the ground terminal and compares the first discharge voltage with the preset reference voltage, and
the control circuit part detects the abnormality of the input discharge part or the output discharge part by using the comparison result of the input voltage and the comparison result of the first discharge voltage.

7. The surge protection device for multi-protection mode communications according to claim 6, wherein the control circuit part detects the abnormality of the input discharge part or the output discharge part if the comparison result of the input voltage and the comparison result of the first discharge voltage are the same as each other while the control circuit part detects the normality of the input discharge part or the output discharge part if the comparison result of the input voltage and the comparison result of the first discharge voltage are different from each other.

8. The surge protection device for multi-protection mode communications according to claim 7, wherein the input discharge part or the output discharge part includes a gas discharge tube GDT which is provided on the input line or the output line in parallel and connected to the ground terminal.

* * * * *